(12) United States Patent
Chang et al.

(10) Patent No.: US 11,800,723 B2
(45) Date of Patent: Oct. 24, 2023

(54) LAYOUT PATTERN OF MAGNETORESISTIVE RANDOM ACCESS MEMORY

(71) Applicant: UNITED MICROELECTRONICS CORP., Hsin-Chu (TW)

(72) Inventors: I-Fan Chang, Tainan (TW); Hung-Yueh Chen, Hsinchu (TW); Rai-Min Huang, Taipei (TW); Jia-Rong Wu, Kaohsiung (TW); Yu-Ping Wang, Hsinchu (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 226 days.

(21) Appl. No.: 17/019,340

(22) Filed: Sep. 13, 2020

(65) Prior Publication Data

US 2022/0052110 A1    Feb. 17, 2022

(30) Foreign Application Priority Data

Aug. 14, 2020   (CN) ......................... 202010816527.7

(51) Int. Cl.
*G11C 11/16* (2006.01)
*H10B 61/00* (2023.01)
*G11C 5/06* (2006.01)
*G11C 5/02* (2006.01)
*H10N 50/80* (2023.01)

(52) U.S. Cl.
CPC ............ *H10B 61/20* (2023.02); *G11C 5/025* (2013.01); *G11C 5/06* (2013.01); *G11C 11/161* (2013.01); *H10N 50/80* (2023.02)

(58) Field of Classification Search
CPC ..... H01L 27/226; H01L 43/02; H01L 27/228; H01L 27/222; G11C 5/025; G11C 5/06; G11C 11/161; H10B 61/20; H10B 61/22; H10B 61/00; H10N 50/80
See application file for complete search history.

(56) References Cited

U.S. PATENT DOCUMENTS

| | | | |
|---|---|---|---|
| 2005/0200384 A1* | 9/2005 | Nadd | H02M 1/088 326/83 |
| 2008/0203503 A1* | 8/2008 | Asao | H10B 61/22 257/E29.323 |
| 2010/0054028 A1* | 3/2010 | Xia | H10B 61/20 365/158 |
| 2012/0199895 A1* | 8/2012 | Nitta | H10B 61/22 257/E27.005 |
| 2012/0224406 A1* | 9/2012 | Chung | G11C 17/06 365/96 |
| 2012/0286339 A1* | 11/2012 | Asao | H10N 50/80 257/295 |

(Continued)

*Primary Examiner* — S M Sohel Imtiaz
(74) *Attorney, Agent, or Firm* — Winston Hsu

(57) ABSTRACT

A layout pattern of a magnetoresistive random access memory (MRAM) includes a first diffusion region and a second diffusion region extending along a first direction on a substrate, a first contact plug extending along a second direction from the first diffusion region to the second diffusion region on the substrate, a first gate pattern and a second gate pattern extending along the second direction adjacent to one side of the first contact plug, and a third gate pattern and a fourth gate pattern extending along the second direction adjacent to another side of the first contact plug.

10 Claims, 3 Drawing Sheets

(56) References Cited

U.S. PATENT DOCUMENTS

| | | | |
|---|---|---|---|
| 2017/0084319 A1* | 3/2017 | Chun | H10B 12/00 |
| 2017/0170234 A1* | 6/2017 | Lee | G11C 11/1659 |
| 2020/0194662 A1* | 6/2020 | Chuang | H10N 50/80 |

* cited by examiner

LAYOUT PATTERN OF MAGNETORESISTIVE RANDOM ACCESS MEMORY

BACKGROUND OF THE INVENTION

1. Field of the Invention

The invention relates to a layout pattern for magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

A layout pattern of a magnetoresistive random access memory (MRAM) includes a first diffusion region and a second diffusion region extending along a first direction on a substrate, a first contact plug extending along a second direction from the first diffusion region to the second diffusion region on the substrate, a first gate pattern and a second gate pattern extending along the second direction adjacent to one side of the first contact plug, and a third gate pattern and a fourth gate pattern extending along the second direction adjacent to another side of the first contact plug.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." The terms "connect", "couple" and "couples" are intended to mean either an indirect or a direct electrical connection. Thus, if a first device couples to a second device, that connection may be through a direct electrical connection, or through an indirect electrical connection via other devices and connections.

Figure 1:
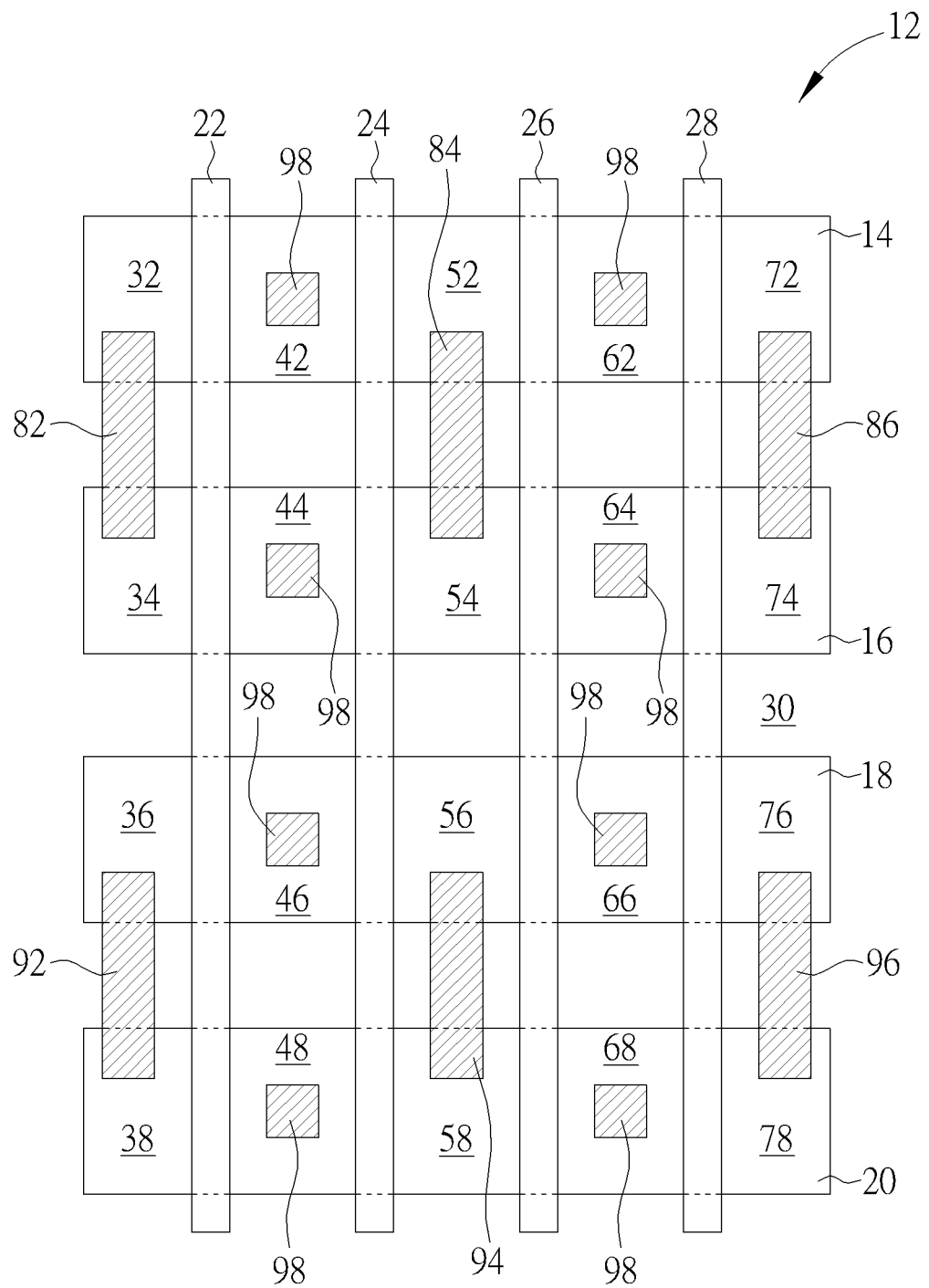
FIG. 1 illustrates a layout pattern of a MRAM device according to an embodiment of the present invention.
Figure 2:
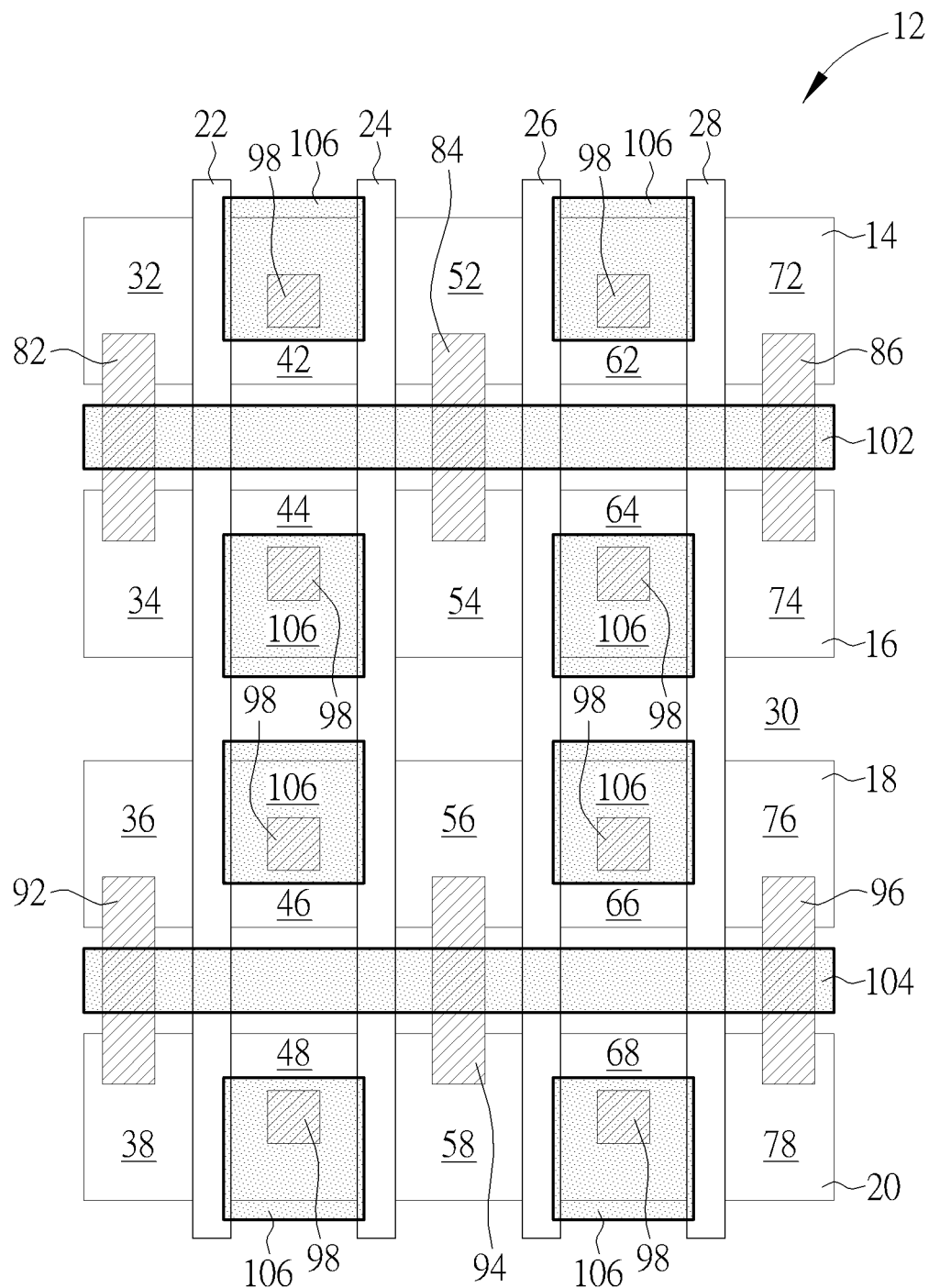
FIG. 2 illustrates a layout pattern of a MRAM device according to an embodiment of the present invention.

Referring to FIGS. 1-2, FIGS. 1-2 illustrate a layout pattern of a MRAM device with elements in different levels according to an embodiment of the present invention. As shown in FIG. 1, a substrate 12 made of semiconductor material is provided, in which the substrate 12 could be selected from the group consisting of silicon (Si), germanium (Ge), Si—Ge compounds, silicon carbide (SiC), and gallium arsenide (GaAs).

A plurality of diffusion regions such as diffusion regions 14, 16, 18, 20 extending along a first direction (such as X-direction) are disposed on the substrate 12, a plurality of gate patterns such as gate patterns 22, 24, 26, 28 are disposed extending along a second direction (such as Y-direction) on the substrate 12, source regions 32, 34, 36, 38, 52, 54, 56, 58, 72, 74, 76, 78 and drain regions 42, 44, 46, 48, 62, 64, 66, 68 are disposed on the diffusion regions 14, 16, 18, 20 adjacent to two sides of the gate patterns 22, 24, 26, 28, and a plurality of contact plugs 82, 84, 86, 92, 94, 96, 98 are disposed adjacent to two sides of the gate patterns 22, 24, 26, 28 extending from the diffusion regions 14, 18 to diffusion regions 16, 20 or directly disposed on the source regions 32, 34, 36, 38, 52, 54, 56, 58, 72, 74, 76, 78 and drain regions 42, 44, 46, 48, 62, 64, 66, 68. A shallow trench isolation (STI) 30 made of silicon oxide is disposed on the substrate 12 surrounding the diffusion regions 14, 16, 18, 20.

In this embodiment each of the diffusion regions 14, 16, 18, 20 could include n-type or p-type dopants, each of the gate patterns 22, 24, 26, 28, could include gate structures made of polysilicon or metal, each of source regions and drain regions could include n-type or p-type dopants depending on the type of transistor being fabricated, and each of the contact plugs 82, 84, 86, 92, 94, 96, 98 could be fabricated according to a single damascene or dual damascene process. Preferably, each of the contact plugs 82, 84, 86, 92, 94, 96, 98 could be fabricated according to a single damascene or dual damascene process, in which each of the contact plugs 82, 84, 86, 92, 94, 96, 98 could further include a barrier layer and/or metal layer. In this embodiment, the barrier layer could be selected from the group consisting of Ti, Ta, TiN, TaN, and WN and the metal layer could be selected from the group consisting of Al, Ti, Ta, W, Nb, Mo, and Cu.

Viewing from a more detailed perspective the source regions and drain regions include a source region 32 disposed on the diffusion region 14 adjacent to left side of the gate pattern 22, a source region 34 disposed on the diffusion region 16 adjacent to left side of the gate pattern 22, a source region 36 disposed on the diffusion region 18 adjacent to left side of the gate pattern 22, a source region 38 disposed on the diffusion region 20 adjacent to left side of the gate pattern 22, a drain region 42 disposed on the diffusion region 14 between the gate patterns 22, 24, a drain region 44 disposed on the diffusion region 16 between the gate patterns 22, 24, a drain region 46 disposed on the diffusion region 18 between the gate patterns 22, 24, a drain region 48 disposed on the diffusion region 20 between the gate patterns 22, 24, a source region 52 disposed on the diffusion region 14 between the gate patterns 24, 26, a source region 54 disposed on the diffusion region 16 between the gate patterns 24, 26, a source region 56 disposed on the diffusion region 18 between the gate patterns 24, 26, a source region 58 disposed on the diffusion region 20 between the gate patterns 24, 26, a drain region 62 disposed on the diffusion region 14 between the gate patterns 26, 28, a drain region 64 disposed on the diffusion region 16 between the gate patterns 26, 28, a drain region 66 disposed on the diffusion region 18 between the gate patterns 26, 28, a drain region 68 disposed on the diffusion region 20 between the gate patterns 26, 28, a source region 72 disposed on the diffusion region 14 adjacent to right side of the gate pattern 28, a source region 74 disposed on the diffusion region 16 adjacent to right side of the gate pattern 28, a source region 76 disposed on the diffusion region 18 adjacent to right side of the gate pattern 28, and a source region 78 disposed on the diffusion region 20 adjacent to right side of the gate pattern 28.

The contact plugs preferably include contact plugs 82, 84, 86 extending along the second direction (such as Y-direction) from the diffusion region 14 through the STI 30 to the diffusion region 16, contact plugs 92, 94, 96 extending from the diffusion region 18 through the STI 30 to the diffusion region 30, and contact plugs 98 disposed on each of the drain regions 42, 44, 46, 48, 62, 64, 66, 68, in which the contact plus 82, 84, 86 are extended and connected from the bottom side of the diffusion region 14 to the upper side of the diffusion region 16 without exceeding or extending over the upper side of the diffusion region 14 and bottom side of the diffusion region 16. Similarly, the contact plugs 92, 94, 96 are extended and connected from the bottom or lower side of the diffusion region 18 to the top or upper side of the diffusion region 20 without extending over the upper side of the diffusion region 18 and bottom side of the diffusion region 20. In this embodiment, each of the contact plugs 82, 84, 86 bridging the diffusion regions 14, 16 and the each of the contact plugs 92, 94, 96 bridging the diffusion regions 18, 20 includes a rectangular shape according to a top view perspective while each of the contact plugs 98 disposed on the drain regions 42, 44, 46, 48, 62, 64, 66, 68 include a square shape.

As shown in FIG. 2, the MRAM device also includes a plurality of first level metal patterns (also referred to as M1) or metal interconnections disposed on the substrate 12 while overlapping the gate patterns 22, 24, 26, 28 and contact plugs 82, 84, 86, 92, 94, 96, in which the first level metal patterns include a metal pattern 102 extending along a first direction (such as X-direction) between the diffusion regions 14, 16 and connected to the contact plugs 82, 84, 86 and source regions 32, 34, 52, 54, 72, 74 underneath, a metal pattern 104 also extending along X-direction between the diffusion regions 18, 20 and connected to the contact plugs 92, 94, 96 and source regions 36, 38, 56, 58, 76, 78 underneath, and metal patterns 104 overlapping and connected to the contact plugs 98 and drain regions 42, 44, 46, 48, 62, 64, 66, 68 underneath.

Viewing from a top view perspective, the metal patterns 102, 104 from the first level metal patterns include substantially rectangular shapes extending along the Y-direction while overlapping the contact plugs 82, 84, 86, 92, 94, 96 and connecting the source regions 32, 34, 36, 38, 52, 54, 56, 58, 72, 74, 76, 78 and the metal patterns 106 include square shapes while overlapping and connecting the drain regions 42, 44, 46, 48, 62, 64, 66, 68 underneath. Preferably, each of the metal patterns 102, 104 from the first level metal patterns is coupled to a source line (SL) for transmitting the signals.

The MRAM device further includes a plurality of first level via patterns (also referred to as V1) on the first level metal patterns M1 and second level metal patterns (also referred to as M2) disposed on the substrate 12 while overlapping the first level metal patterns and first level via patterns. Moreover, the MRAM device includes a plurality of MTJs disposed on the second level metal patterns and coupled to the second level metal patterns underneath or drain regions on even lower level. Since each of the MTJs is disposed on the second level metal patterns, the MTJs could also be referred to as third level metal patterns or M3. For simplicity purpose, the first level via patterns, second level metal patterns, and MTJs are not shown in the aforementioned figures.

In this embodiment, each of the MTJs preferably includes a bottom electrode, a pinned layer, a barrier layer, a free layer, and a top electrode disposed on the second level metal patterns. Preferably, the bottom electrode and the top electrode are made of conductive material including but not limited to for example Ta, Pt, Cu, Au, Al, or combination thereof. The pinned layer could be made of ferromagnetic material including but not limited to for example iron, cobalt, nickel, or alloys thereof such as cobalt-iron-boron (CoFeB) or cobalt-iron (CoFe). Moreover, the pinned layer could also be made of antiferromagnetic (AFM) material including but not limited to for example ferromanganese (FeMn), platinum manganese (PtMn), iridium manganese (IrMn), nickel oxide (NiO), or combination thereof, in which the pinned layer is formed to fix or limit the direction of magnetic moment of adjacent layers. The barrier layer could be made of insulating material including but not limited to for example oxides such as aluminum oxide ($AlO_x$) or magnesium oxide (MgO). The free layer could be made of ferromagnetic material including but not limited to for example iron, cobalt, nickel, or alloys thereof such as cobalt-iron-boron (CoFeB), in which the magnetized direction of the free layer could be altered freely depending on the influence of outside magnetic field.

Figure 3:
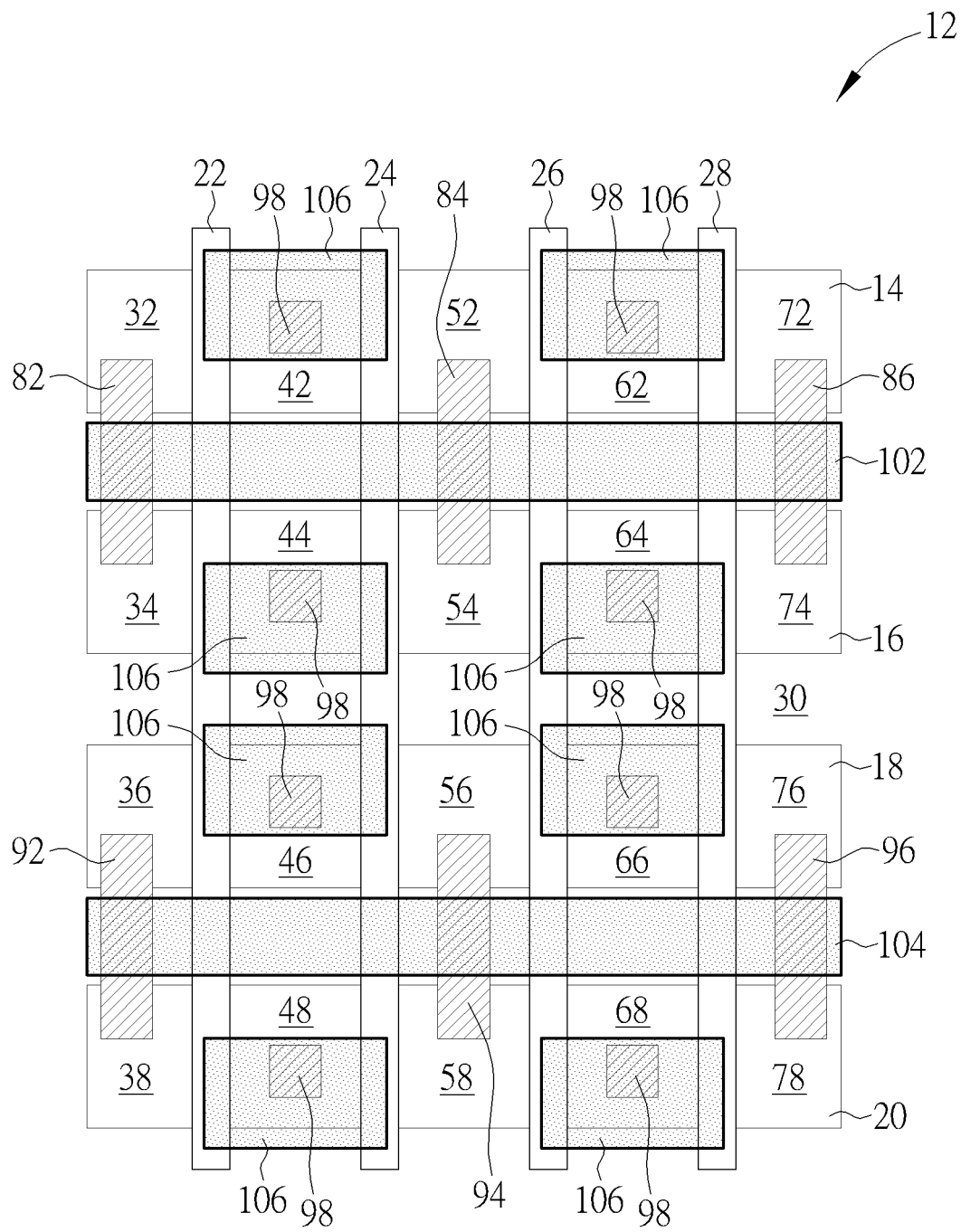
FIG. 3 illustrates a layout pattern of a MRAM device according to an embodiment of the present invention.

Referring to FIG. 3, FIG. 3 illustrates a layout pattern of a MRAM device according to an embodiment of the present invention. As shown in FIG. 3, it would be desirable to reduce the overall cell size of the MRAM device by shrinking the area of the diffusion regions and/or metal patterns such as the first level metal patterns M1. Preferably, in contrast to the metal pattern 106 overlapping the drain regions 42, 44, 46, 48, 62, 64, 66, 68 being square patterns as shown in the aforementioned embodiment, it would be desirable to adjust the size of the metal patterns 106 by forming metal patterns 106 with rectangular shapes according to a top view perspective so that the left and right edges of the metal patterns 106 could now overlap more gate patterns 22, 24, 26, 28.

Overall, in contrast to first level metal patterns M1 overlapping most of the diffusion regions including source regions and drain regions in layout pattern of current MRAM devices, the present invention preferably forms contact plugs 82, 84, 86 to bridge between source regions 32, 34, 52, 54, 72, 74 on diffusion regions 14, 16 and/or contact plugs 92, 94, 96 to bridge between source regions 36, 38, 56, 58, 76, 78 on diffusion regions 18, 20. By following this design, it would be desirable to provide much greater process window for the first level metal patterns M1 formed afterwards so that less area is occupied by the first level metal patterns for improving performance of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A layout pattern of a magnetoresistive random access memory (MRAM), comprising:
    a first diffusion region and a second diffusion region extending along a first direction on a substrate;
    a first contact plug extending along a second direction from the first diffusion region to the second diffusion region on the substrate, wherein the first direction is orthogonal to the second direction;
    a first gate pattern and a second gate pattern extending along the second direction adjacent to one side of the first contact plug;
    a third gate pattern and a fourth gate pattern extending along the second direction adjacent to another side of the first contact plug;
    a second contact plug on the first diffusion region adjacent to one side of the first gate pattern, wherein the first contact plug comprises a rectangle and the second contact plug comprises a square according to a top view; and
    a first metal pattern extending along the first direction between the first diffusion region and the second diffusion region.

2. The layout pattern of a MRAM of claim 1, further comprising:
    a first drain region between the first gate pattern and the second gate pattern on the first diffusion region;
    a first source region between the second gate pattern and the third gate pattern on the first diffusion region;
    a second drain region between the first gate pattern and the second gate pattern on the second diffusion region; and
    a second source region between the second gate pattern and the third gate pattern on the second diffusion region.

3. The layout pattern of a MRAM of claim 2, wherein the first contact plug is on the first source region and the second source region.

4. The layout pattern of a MRAM of claim 2, further comprising:
    the second contact plug on the first drain region; and
    a third contact plug on the second drain region.

5. The layout pattern of a MRAM of claim 4, further comprising:
    a second metal pattern overlapping the second contact plug; and
    a third metal pattern overlapping the third contact plug.

6. The layout pattern of a MRAM of claim 5, wherein the first metal pattern overlaps the first gate pattern, the second gate pattern, the third gate pattern, the fourth gate pattern, and the first contact plug.

7. The layout pattern of a MRAM of claim 5, wherein the first metal pattern comprises a rectangle according to a top view.

8. The layout pattern of a MRAM of claim 5, wherein the second metal pattern comprises a square according to a top view.

9. The layout pattern of a MRAM of claim 5, wherein the second metal pattern comprises a rectangle according to a top view.

10. A layout pattern of a magnetoresistive random access memory (MRAM), comprising:
    a first diffusion region and a second diffusion region extending along a first direction on a substrate;
    a first contact plug extending along a second direction from the first diffusion region to the second diffusion region on the substrate, wherein the first direction is orthogonal to the second direction;
    a first gate pattern and a second gate pattern extending along the second direction adjacent to one side of the first contact plug;
    a third gate pattern and a fourth gate pattern extending along the second direction adjacent to another side of the first contact plug;
    a second contact plug on the first diffusion region adjacent to one side of the first gate pattern, wherein the first contact plug comprises a rectangle and the second contact plug comprises a square according to a top view;
    a first drain region between the first gate pattern and the second gate pattern on the first diffusion region, wherein the second contact plug is on the first drain region;
    a first source region between the second gate pattern and the third gate pattern on the first diffusion region;
    a second drain region between the first gate pattern and the second gate pattern on the second diffusion region;
    a second source region between the second gate pattern and the third gate pattern on the second diffusion region, wherein the first contact plug is on the first source region and the second source region;
    a third contact plug on the second drain region;
    a first metal pattern extending along the first direction between the first diffusion region and the second diffusion region;
    a second metal pattern overlapping the second contact plug; and
    a third metal pattern overlapping the third contact plug.

* * * * *